United States Patent
Lai et al.

(10) Patent No.: US 11,137,559 B2
(45) Date of Patent: Oct. 5, 2021

(54) OPTICAL CHIP PACKAGE AND METHOD FOR FORMING THE SAME

(71) Applicant: XINTEC INC., Taoyuan (TW)

(72) Inventors: Jiun-Yen Lai, Taipei (TW); Yu-Ting Huang, Taoyuan (TW); Hsing-Lung Shen, Hsinchu (TW); Tsang-Yu Liu, Zhubei (TW); Hui-Hsien Wu, Taoyuan (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 16/851,099

(22) Filed: Apr. 17, 2020

(65) Prior Publication Data

US 2020/0333542 A1 Oct. 22, 2020

Related U.S. Application Data

(60) Provisional application No. 62/837,076, filed on Apr. 22, 2019.

(51) Int. Cl.
*G02B 6/42* (2006.01)

(52) U.S. Cl.
CPC ......... *G02B 6/4259* (2013.01); *G02B 6/4244* (2013.01)

(58) Field of Classification Search
CPC ............ H01L 21/02021; H01L 21/784; G02B 6/4259
See application file for complete search history.

(56) References Cited

U.S. PATENT DOCUMENTS

| | | | |
|---|---|---|---|
| 7,183,136 B2 * | 2/2007 | Hashimura | B23K 26/18 438/113 |
| 8,525,345 B2 * | 9/2013 | Yen | H01L 23/49827 257/774 |
| 8,715,592 B2 | 5/2014 | Dekker et al. | |
| 8,952,501 B2 * | 2/2015 | Huang | H01L 21/561 257/623 |
| 9,620,431 B2 * | 4/2017 | Cheng | H01L 29/0657 |
| 9,653,422 B2 * | 5/2017 | Shen | H01L 24/32 |
| 9,721,907 B2 * | 8/2017 | Oefner | H01L 21/02035 |
| 9,899,349 B2 * | 2/2018 | Celaya | H01L 21/561 |
| 10,083,921 B2 * | 9/2018 | Lin | H01L 23/585 |
| 10,559,471 B2 * | 2/2020 | Morikawa | B24B 7/228 |

FOREIGN PATENT DOCUMENTS

JP 5258807 8/2013

\* cited by examiner

*Primary Examiner* — Rhonda S Peace
(74) *Attorney, Agent, or Firm* — Liu & Liu

(57) ABSTRACT

An optical chip package is provided. The optical chip package includes a first transparent substrate, a second transparent substrate, and a spacer layer. The first and second transparent substrates each has a first surface and a second surface opposite the first surface. The first transparent substrate has a thickness that is different than that of the second transparent substrate. The second transparent substrate is disposed over the first transparent substrate, and the spacer layer is bonded between the second surface of the first transparent substrate and the first surface of the second transparent substrate. The recess region extends from the second surface of the second transparent substrate into the first transparent substrate, so that the first transparent substrate has a step-shaped sidewall. A method of forming an optical chip package is also provided.

29 Claims, 7 Drawing Sheets

US 11,137,559 B2

OPTICAL CHIP PACKAGE AND METHOD FOR FORMING THE SAME

CROSS REFERENCE TO RELATED APPLICATIONS

This application claims the benefit of U.S. Provisional Application No. 62/837,076 filed on Apr. 22, 2019, the entirety of which is incorporated by reference herein.

BACKGROUND OF THE INVENTION

Field of the Invention

The invention relates to chip package technology, and in particular to an optical chip package and a method for forming the same.

Description of the Related Art

As demand increases for electronic and optoelectronic products such as mobile phones, optical chip packages using transparent substrates (e.g., glass, quartz, or sapphire) must be developed rapidly, as product trends require miniaturization of the optical chip package. The optical chip package process is becoming an important process in the fabrication of electronic products, due to performance demands, and for operational stability.

An optical chip package includes transparent substrates (e.g., glass substrates) bonded to each other. The fabrication of such an optical chip package includes dicing glass wafers (which have circuits and are bonded together by an adhesive layer), so as to form individual optical chip packages. However, the glass wafer is brittle and easily broken. Accordingly, the edge of the optical chip package can break easily, which may cause chipping while the bonded glass wafers are being diced. As a result, the yield of the optical chip package is reduced.

Accordingly, there is a need for a novel optical chip package and methods for forming the same capable of eliminating or mitigating the aforementioned problems.

BRIEF SUMMARY OF THE INVENTION

An embodiment of the invention provides an optical chip package which includes a first transparent substrate, a second transparent substrate, and a spacer layer. The first and second transparent substrates each has a first surface and a second surface opposite the first surface. A thickness of the first transparent substrate is different than the thickness of the second transparent substrate. The second transparent substrate is disposed over the first transparent substrate, and the spacer layer is bonded between the second surface of the first transparent substrate and the first surface of the second transparent substrate. A recess region extends from the second surface of the second transparent substrate into the first transparent substrate, so that the first transparent substrate has a step-shaped sidewall.

An embodiment of the invention provides a method for forming an optical chip package which includes providing a first transparent substrate and a second transparent substrate, in which the first transparent substrate and the second transparent substrate each has a first surface and a second surface opposite the first surface, and includes a chip region and a scribe line region surrounding the chip region; bonding the second surface of the first transparent substrate to the first surface of the second transparent substrate using a spacer layer; performing a thinning process on the first surface of the first transparent substrate and the second surface of the second transparent substrate, so that a thickness of the first transparent substrate is different than the thickness of the second transparent substrate; and performing a first dicing process through the use of a first dicing saw, to form a first opening in the scribe line region of the first transparent substrate and the scribe line region of the second transparent substrate, in which the first opening extends from the second surface of the second transparent substrate into the first transparent substrate.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The making and using of the embodiments of the present disclosure are discussed in detail below. However, it should be noted that the embodiments provide many applicable inventive concepts that can be embodied in a variety of specific methods. The specific embodiments discussed are merely illustrative of specific methods to make and use the embodiments, and do not limit the scope of the disclosure. In addition, the present disclosure may repeat reference numbers and/or letters in the various embodiments. This repetition is for the purpose of simplicity and clarity, and does not imply any relationship between the different embodiments and/or configurations discussed. Furthermore, when a first material layer is referred to as being on or overlying a second material layer, the first material layer may be in direct contact with the second material layer, or spaced apart from the second material layer by one or more material layers.

The optical chip package of the embodiments of the invention may be implemented to package active or passive devices or electronic components of integrated circuits, such as digital or analog circuits. For example, the optical chip package is related to optoelectronic devices, micro-electro-mechanical systems (MEMS), biometric devices, micro fluidic systems, and physical sensors measuring changes to physical quantities such as heat, light, capacitance, pressure, and so on. In particular, a wafer-level package (WSP) process may optionally be used to fabricate such an optical chip package.

The above-mentioned wafer-level package process mainly means that after the packaging step is accomplished during the wafer stage, the wafer with chips is cut to obtain individual packages. In addition, the above-mentioned wafer-level package process may also be adapted to form an optical chip package having multi-layer integrated circuit devices by a stack of wafers having integrated circuits.

The following embodiments may discuss specific examples. However, those skilled in the art will recognize that various applications can be used in some other embodiments when they read the present disclosure. It should be noted that the embodiments discussed herein may not describe each of elements that may exist in the structure. For example, the element may be omitted in the accompanying figures when various aspects of the embodiments can be sufficiently expressed through the discussion of the element. Moreover, the embodiments discussed herein may not describe each of manufacturing steps, and the method of forming the chip package may be discussed using a specific manufacturing step order. However, in some embodiments, the chip package can be fabricated by any reasonable manufacturing step order.

Figure 1:
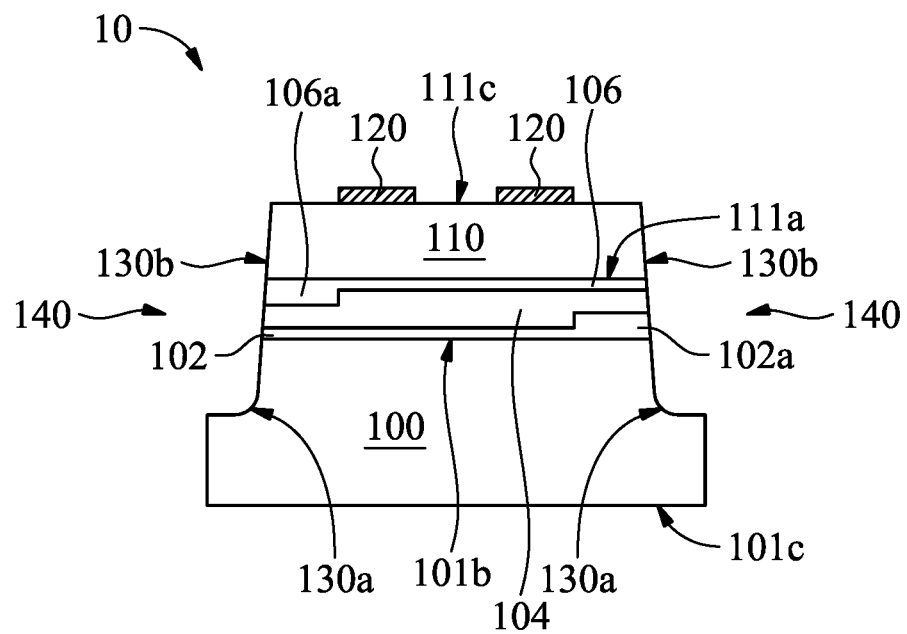
FIG. 1 is a cross-sectional view of an exemplary embodiment of an optical chip package in accordance with some embodiments of the invention.

FIG. 1 is a cross-sectional view of an exemplary embodiment of an optical chip package 10 in accordance with some embodiments of the invention. As shown in FIG. 1, in some embodiments, the optical chip package 10 includes a first transparent substrate 100. In some embodiments, the first transparent substrate 100 is formed of glass, quartz, or sapphire. The first transparent substrate 100 has a first surface 101c (e.g., lower surface) and a second surface 101b (e.g., upper surface) opposite the first surface 101c.

In some embodiments, the optical chip package 10 further includes a first optical material layer 102 disposed on the second surface 101b of the first transparent substrate 100. In some embodiments, a first optical chip is comprised of the first optical material layer 102 and the first transparent substrate 100. In some embodiments, the surface of the first optical material layer 102 opposite the second surface 101b of the first transparent substrate 100 includes an optical pattern 102a to change the optical path of the incident light passing through the first optical material layer 102.

In some embodiments, the first optical material layer 102 includes an inorganic material, such as silicon oxide, silicon nitride, silicon oxynitride, metal oxide, or a combination thereof, or another suitable insulating material.

In some embodiments, the optical chip package 10 includes a second transparent substrate 110. In some embodiments, the second transparent substrate 110 is formed of glass, quartz, or sapphire. The second transparent substrate 110 has a first surface 111a (e.g., lower surface) and a second surface 111c (e.g., upper surface) opposite the first surface 111a. The second transparent substrate 110 is disposed over the first transparent substrate 100, so that the second surface 111c of the second transparent substrate 110 opposite the first surface 101c of the first transparent substrate 100.

In some embodiments, the optical chip package 10 further includes a second optical material layer 106 disposed on the first surface 111a of the second transparent substrate 110. In some embodiments, a second optical chip is comprised of the second optical material layer 106 and the second transparent substrate 110. In some embodiments, the surface of the second optical material layer 106 opposite the first surface 111a of the second transparent substrate 110 includes an optical pattern 106a to change the optical path of the incident light passing through the second optical material layer 106.

In some embodiments, the second optical material layer 106 includes an inorganic material, such as silicon oxide, silicon nitride, silicon oxynitride, metal oxide, or a combination thereof, or another suitable insulating material. In some embodiments, the optical pattern 106a of the second optical material layer 106 is similar to or different to the optical pattern 102a of the first optical material layer 102.

In some embodiments, the optical chip package 10 further includes a spacer layer 104 disposer between the first optical material layer 102 and the second optical material layer 106 to bond the second surface 101b of the first transparent substrate 100 and the to the first surface 111a of the second transparent substrate 110. Namely, the first optical material layer 102 is disposed between the second surface 101b of the first transparent substrate 100 and the spacer layer 104, and the second optical material layer 106 is disposed between the first surface 111a of the second transparent substrate 110 and the spacer layer 104.

In some embodiments, the spacer layer 104 covers the first optical material layer 102 and the second optical material layer 106, so that there is no cavity between the first transparent substrate 100 and the second transparent substrate 110. In some embodiments, the spacer layer 104 does not substantially absorb moisture and is non-adhesive. In those cases, the first optical chip (which includes the first transparent substrate 100 and the first optical material layer 102), the second optical chip (which includes the second transparent substrate 110 and the second optical material layer 106), and the spacer layer 104 through additional adhesive layers.

In some other embodiments, the spacer layer 104 may itself be adhesive. In those cases, the first optical chip can attach to the second optical chip by the spacer layer 104. As a result, the spacer layer 104 may contact none of the adhesion glue, thereby assuring that the spacer layer 104 will not move due to the disposition of the adhesion glue. Furthermore, since the adhesion glue is not needed, the first optical material layer 102 and the second optical material layer 106 can be prevented from being contaminated by an overflow of adhesion glue.

In some embodiments, the spacer layer 104 includes an epoxy resin, an inorganic material (such as silicon oxide, silicon nitride, silicon oxynitride, metal oxide, or a combination thereof), an organic polymer material (such as polyimide, butylcyclobutene (BCB), parylene, polynaphthalenes, fluorocarbons or acrylates), a photoresist material, or another suitable insulating layer.

In some embodiments, the first optical material layer 102 has a film stress that is different the film stress of the second optical material layer 106. Therefore, the thickness of the first transparent substrate 100 is different than that of the second transparent substrate 110 to avoid or reduce warpage while the first optical chip and the second optical chip are being bonded. In some embodiments, the film stress of the first optical material layer 102 is less than the film stress of the second optical material layer 106. In those cases, the thickness of the first transparent substrate 100 is greater than the thickness of the second transparent substrate 110. In some other embodiments, the film stress of the first optical material layer 102 is greater than the film stress of the second optical material layer 106. In those cases, the thickness of the first transparent substrate 100 is less than the thickness of the second transparent substrate 110.

In some embodiments, the optical chip package 10 further includes a conductive pattern layer 120 disposed the second surface 111c of the second transparent substrate 110, as shown in FIG. 1. Alternatively, the conductive pattern layer 120 is disposed on the first surface 101c of the first transparent substrate 100. In some other embodiments, the conductive pattern layer 120 is disposed on the second surface 111c of the second transparent substrate 110 and the first surface 101c of the first transparent substrate 100. In some embodiments, the conductive pattern layers 120 are made of a transparent conductive material, such as indium tin oxide (ITO), indium zinc (IZO), or the like. In some other embodiments, the conductive pattern layer 120 is formed of an opaque conductive material, such as metal.

In some embodiments, the optical chip package 10 further includes a recess structure 140 extending through the spacer layer 140 from the second surface 111c of the second transparent substrate 110, and terminated within the first transparent substrate 100. The recess structure 140 surrounds the first transparent substrate 100, the spacer layer 104, and the second transparent substrate 110, so that the first transparent substrate 100 includes a step-shaped sidewall, such as a two-step sidewall. In some embodiments, the recess structure 140 includes a recess 130b. In some embodiments, the recess 130b has a tapered sidewall, and the bottom of the recess 130b below the second surface 101b of the first transparent substrate 100 has a rounded corner 130a. In some other embodiments, the recess 130b has a perpendicular sidewall.

Figure 2A:
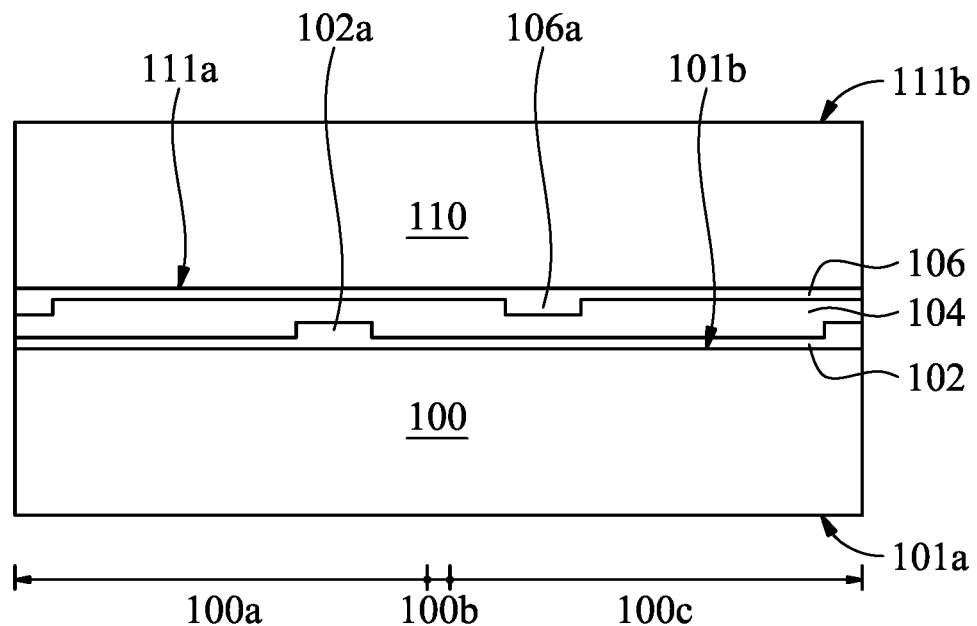
FIGS. 2A to 2E are cross-sectional views of an exemplary embodiment of a method for forming an optical chip package in accordance with some embodiments of the invention.

FIGS. 2A to 2E are cross-sectional views of an exemplary embodiment of a method for forming an optical chip package in accordance with some embodiments of the invention. Elements in FIGS. 2A to 2E that are the same as those in FIG. 1 are labeled with the same reference numbers as in FIG. 1 and are not described again for brevity. Refer to FIG. 2A, a first transparent substrate 100 and a second transparent substrate 110 are provided. The first transparent substrate 100 has a first surface (e.g., lower surface) 101a and a second surface (e.g., upper surface) 101b opposite the first surface 101a, and has chip regions and a scribe line region surrounding the chip regions and separated the adjacent chip regions from each other. Similarly, the second transparent substrate 110 has a first surface (e.g., lower surface) 111a and a second surface (e.g., upper surface) 111b opposite the first surface 111a. To simplify the diagram, only two adjacent chip region 100a and a scribe line region 100b separating these chip regions 100a are depicted herein.

In some embodiments, the first transparent substrate 100 and the second transparent substrate 110 are a glass wafer or another transparent wafer so as to facilitate the wafer-level packaging process. In some other embodiments, the first transparent substrate 100 and the second transparent substrate 110 are a glass substrate.

Afterwards, a first optical material layer 102 is formed on the second surface 101b of the first transparent substrate 100, and a second optical material layer 106 is formed on the first surface 111a of the second transparent substrate 110, in which the film stress of the first optical material layer 102 is different than the film stress of the second optical material layer 106.

In some embodiments, the surface of the first optical material layer 102 opposite the second surface 101b of the first transparent substrate 100 includes an optical pattern 102a to change the optical path of the incident light passing through the first optical material layer 102. Moreover, the surface of the second optical material layer 106 opposite the first surface 111a of the second transparent substrate 110 includes an optical pattern 106a. In some embodiments, the first optical material layer 102 and the second optical material layer 106 include an inorganic material, such as silicon oxide, silicon nitride, silicon oxynitride, metal oxide, or a combination thereof, or another suitable insulating material.

In some embodiments, after the first optical material layer 102 and the second optical material layer 106 are formed, the second surface 101b of the first transparent substrate 100 and the first surface 111a of the second transparent substrate 110 are bonded via a spacer layer 104, so that the spacer layer 104 is formed between the first optical material layer 102 and the second optical material layer 106. In some embodiments, the spacer layer 104 covers the first optical material layer 102 and the second optical material layer 106, so that there is no cavity between the first transparent substrate 100 and the second transparent substrate 110. In some embodiments, the spacer layer 104 is formed by a deposition process (such as a coating process, a physical vapor deposition process, a chemical vapor deposition process or another suitable process).

In some embodiments, the spacer layer 104 may itself be adhesive or non-adhesive. For example, the first transparent substrate 100, the second transparent substrate 111, and the spacer layer 104 can be bonded through additional adhesive layers when the spacer layer 104 is non-adhesive.

In some embodiments, the spacer layer 104 is made of a transparent insulating material, including epoxy resin, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons, acrylates, photoresist material, or another suitable insulating material.

Figure 2B:
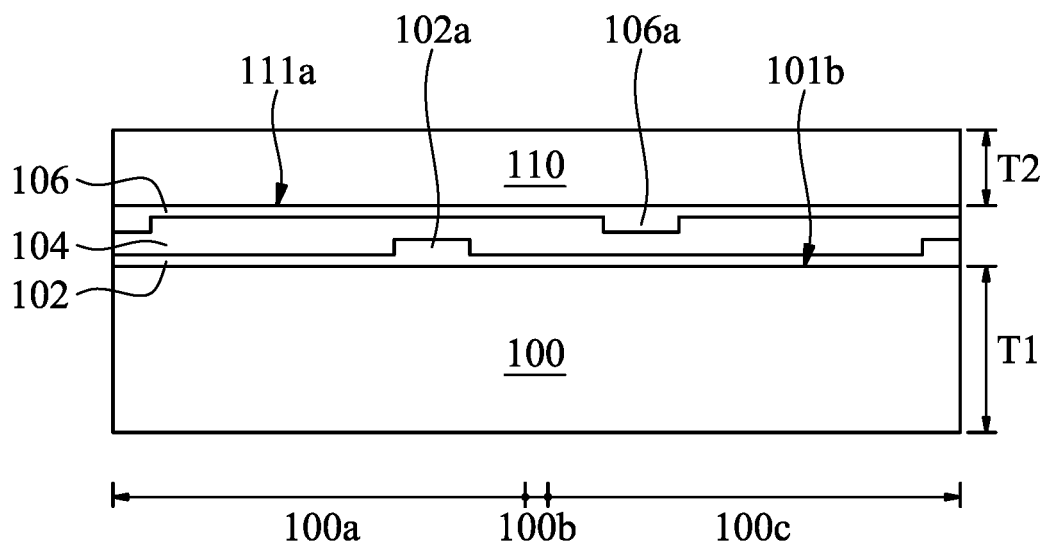

Refer to FIG. 2B, a thinning process (such as an etching process, a milling process, a grinding process or a polishing process) is performed on the first surface 101a of the first transparent substrate 100 and the second surface 111b of the second transparent substrate 110, so that the thickness T1 of the first transparent substrate 100 is different than the thickness T2 of the second transparent substrate 110. In some embodiments, the ratio of the thickness T1 to the thickness T2 (T1/T2) is greater than 1.4 when the thickness T1 is greater than the thickness T2. Alternatively, the ratio of the thickness T2 to the thickness T1 (T2/T1) is greater than 1.4 when the thickness T1 is less than the thickness T2. In some embodiments, the thickness of the first transparent substrate 100 and the second transparent substrate 110 are each about 500 μm before the thinning process. Moreover, the film stress of the first optical material layer 102 is less than the film stress of the second optical material layer 106. In those cases, the thickness T1 of the first transparent substrate 100 is greater than the thickness T2 of the second transparent substrate 110 after performing the thinning process. For example, the thickness T1 is about 220 μm, and the thickness T2 is about 160 μm. In some other embodiments, the thickness of the first transparent substrate 100 and the second transparent substrate 110 are each about 500 μm before the thinning process. Moreover, the film stress of the first optical material layer 102 is greater than the film stress of the second optical material layer 106. In those cases, the thickness T1 of the first transparent substrate 100 is less than the thickness T2 of the second transparent substrate 110 after performing the thinning process. Since the film stress of the first optical material layer 102 is different than the film stress of the second optical material layer 106, the film stress difference from the first optical material layer 102 and the second optical material layer 106 can be withstood by the thicker transparent substrate. Therefore, the warpage of the bonded first and second transparent substrates 100 and 110 can be avoided or reduced. As a result, it is not necessary to use an additional carrier substrate to bond the first transparent substrate 100 or the second transparent substrate 110 for the subsequent dicing process. Moreover, the handling ability of the robot end-effector for the bonded first and second transparent substrates 100 and 110 can be improved.

Figure 2C:
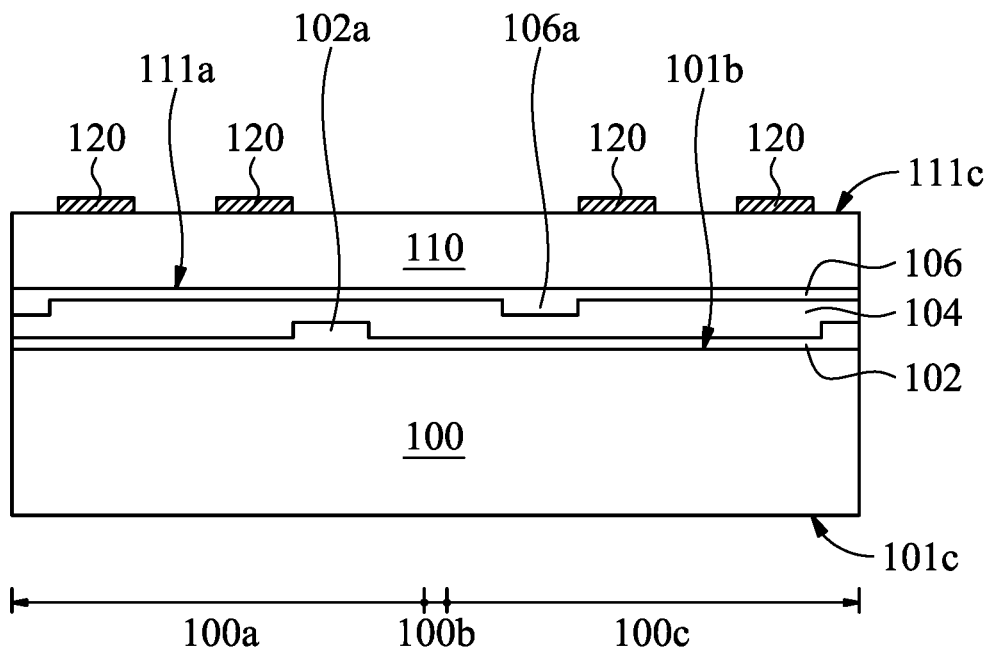

Refer to FIG. 2C, a conductive pattern layer 120 is formed on the second surface 111c (i.e., the thinned surface) of the second transparent substrate 110 after performing the thinning process. Alternatively, the conductive pattern layer 120 may be formed on the first surface 101c (i.e., the thinned surface) of the first transparent substrate 100.

In some embodiments, the conductive pattern layer 120 is formed by a deposition process (e.g., a physical vapor deposition process, a chemical vapor deposition process or another suitable process) and a patterning process (e.g., lithography and etching processes). In some embodiments, the conductive pattern layers 120 are made of a transparent conductive material, such as ITO, IZO, or the like. In some other embodiments, the conductive pattern layer 120 is formed of an opaque conductive material, such as metal.

Figure 2D:
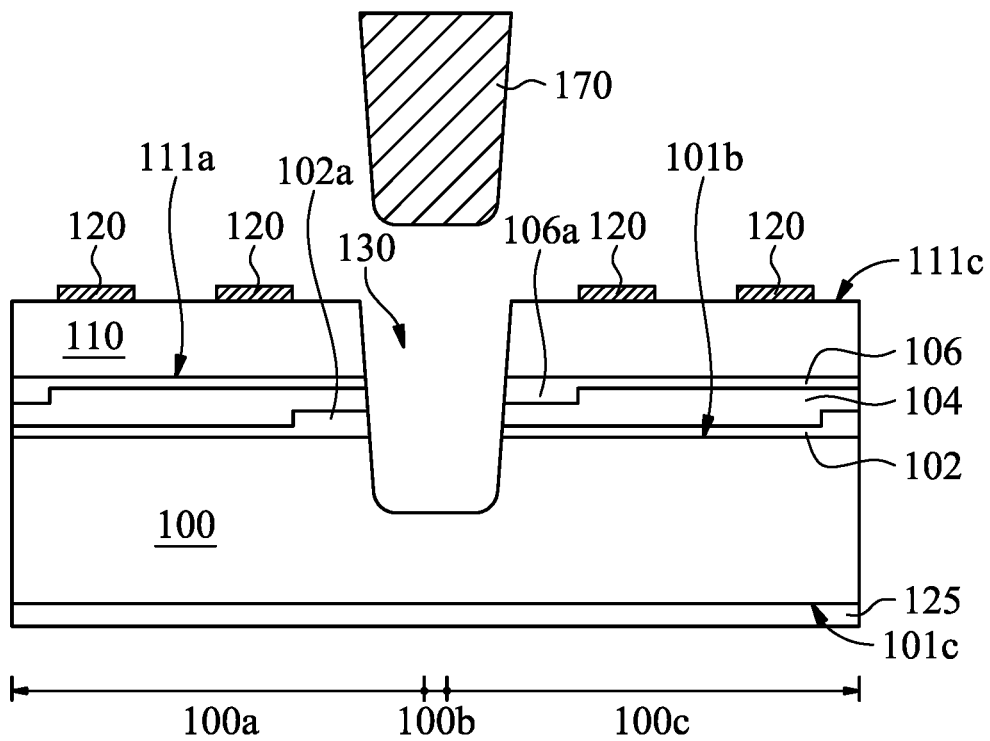

Refer to FIG. 2D, a tape layer 125 is adhered onto the first surface 101c of the first transparent substrate 100 after forming the conductive pattern layer 120. Afterwards, a dicing process is performed by a dicing saw 170, to form an opening 130 at the scribe line region 100b of the first transparent substrate 100 and the scribe line region (not shown) of the second transparent substrate 110. In some embodiments, the opening 130 passes through the spacer layer 104 from the second surface 111c of the second transparent substrate 110 and is terminated within the first transparent substrate 100, so that the bottom of the opening 130 is located below the second surface 101b of the first transparent substrate 100 and has rounded corners 130a.

Figure 2E:
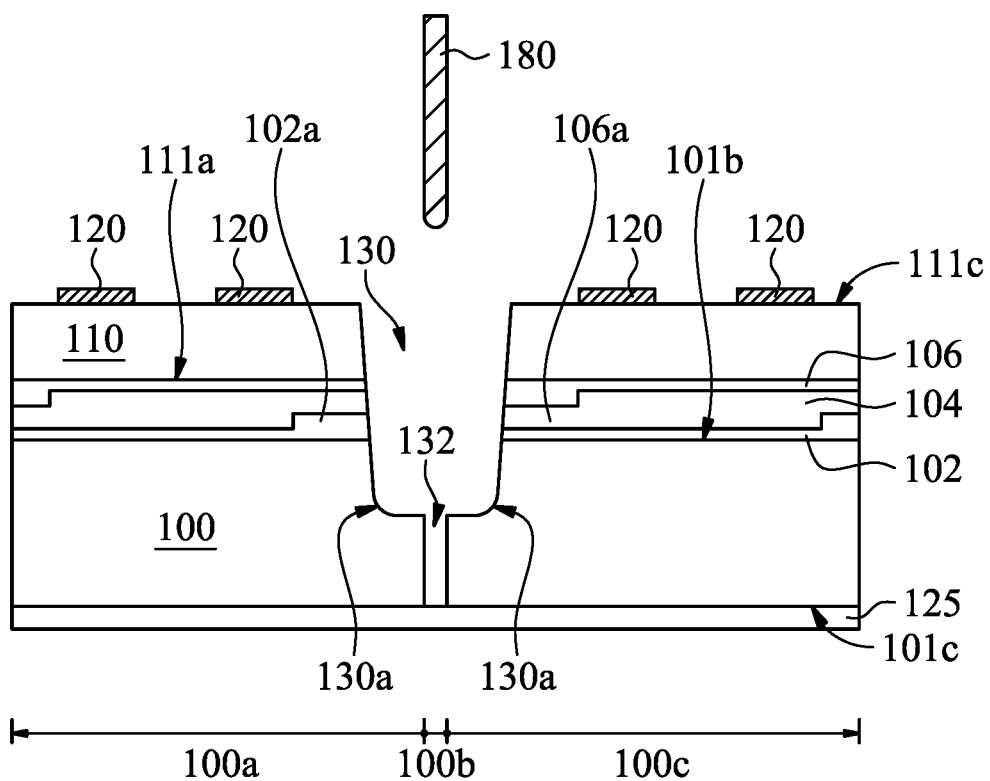

Refer to FIG. 2E, another dicing process is performed by a dicing saw 180 after forming the opening 130, to form an opening 132 below the bottom of the opening 130, thereby passing through the first transparent substrate 100 to expose the tape layer 125, so that the first transparent substrate 100 has a step-shaped sidewall (e.g., a two-step sidewall). In some embodiments, the opening 130 has a tapered sidewall, and the opening 132 has a perpendicular sidewall.

In some embodiments, the width of the dicing saw 170 is greater than the width of the dicing saw 180, so that the width of the opening 130 is greater than the width of the opening 132. In some embodiments, the width of the dicing saw 170 is about 110 µm, and the width of the dicing saw 180 is about 80 µm. Moreover, the feed rate of the dicing saw 170 is about 12 mm/sec, and the feed rate of the dicing saw 180 is about 5 mm/sec. The tape layer 125 is removed after performing the two-step dicing process, so as to form an individual optical chip package 10 having the recess structure 140, as shown in FIG. 1.

Since the fabrication of the optical chip package 10 uses different dicing saws to perform the two-step dicing process, the loading of the dicing saw (the force applied on the dicing saw) can be reduced as compared to the use of a single dicing saw to perform the single dicing process. As a result, the stability of the dicing process can be increased, and chipping of the optical chip package 10 can be prevented or mitigated.

Figure 3:
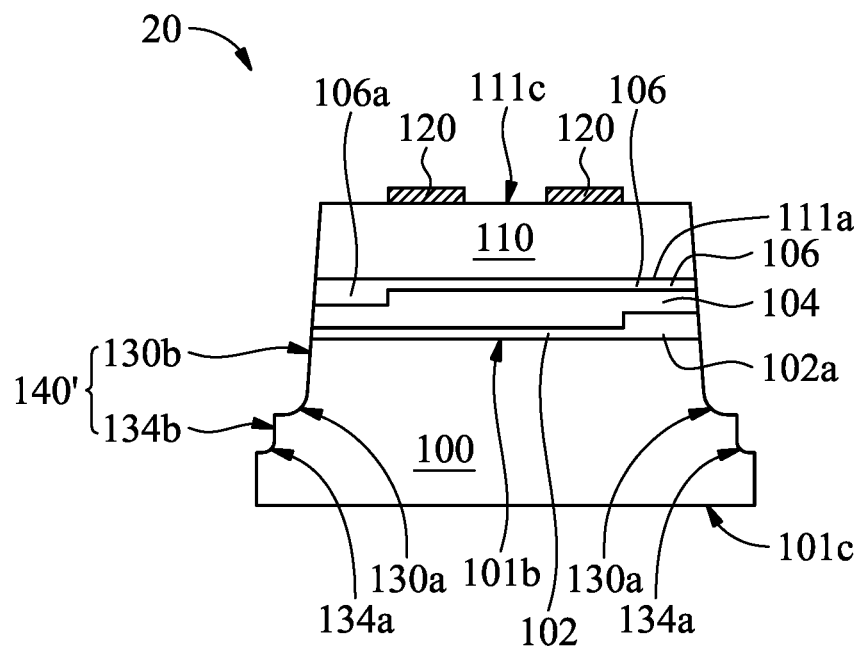
FIG. 3 is a cross-sectional view of an exemplary embodiment of an optical chip package in accordance with some embodiments of the invention.

Refer to FIG. 3, which is a cross-sectional view of an exemplary embodiment of an optical chip package 20 in accordance with some embodiments of the invention. Elements in FIG. 3 that are the same as those in FIG. 1 are labeled with the same reference numbers as in FIG. 1 and are not described again for brevity. The structure of the optical chip package 20 is similar to that of the optical chip package 10 shown in FIG. 1. The difference is the recess structure 140' of the optical chip package 20 includes a recess 130b and a recess 134b. The recess 134b extends from the bottom of the recess 130b toward the first surface 101c of the first transparent substrate 100. Similar to the recess 130b, the bottom of the recess 134b has a rounded corner 134a. In some embodiments, the recess 130b has a tapered sidewall, and the recess 134b has a perpendicular sidewall. In some other embodiments, the recess 130b has a perpendicular sidewall.

Figure 4A:
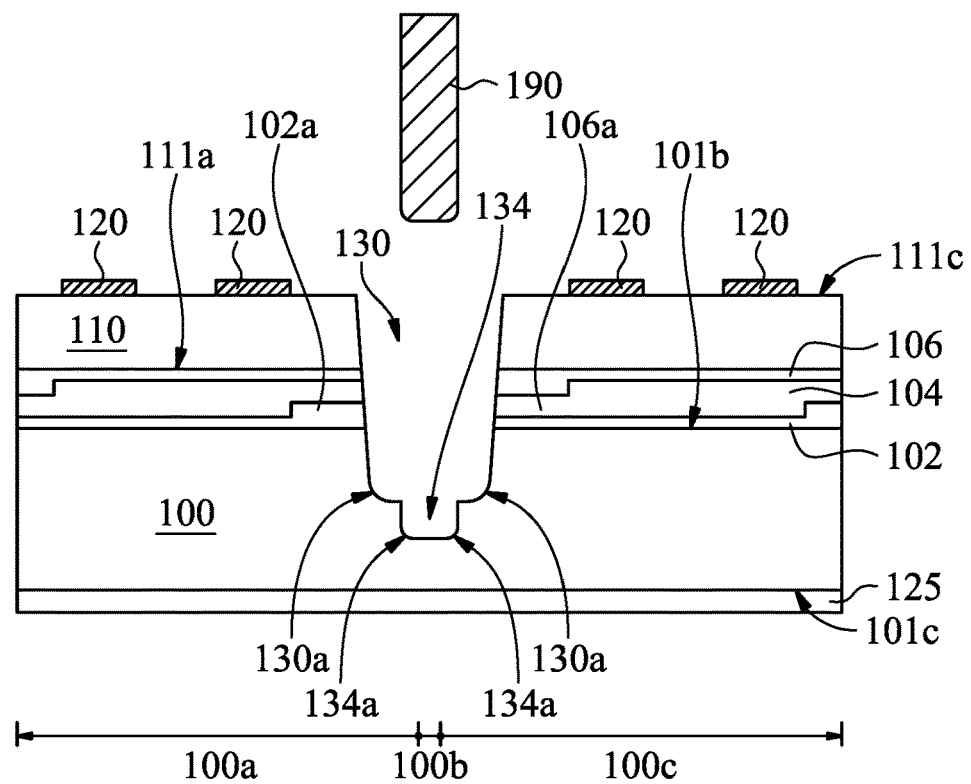
FIGS. 4A to 4B are cross-sectional views of an exemplary embodiment of a method for forming an optical chip package in accordance with some embodiments of the invention.
Figure 4B:
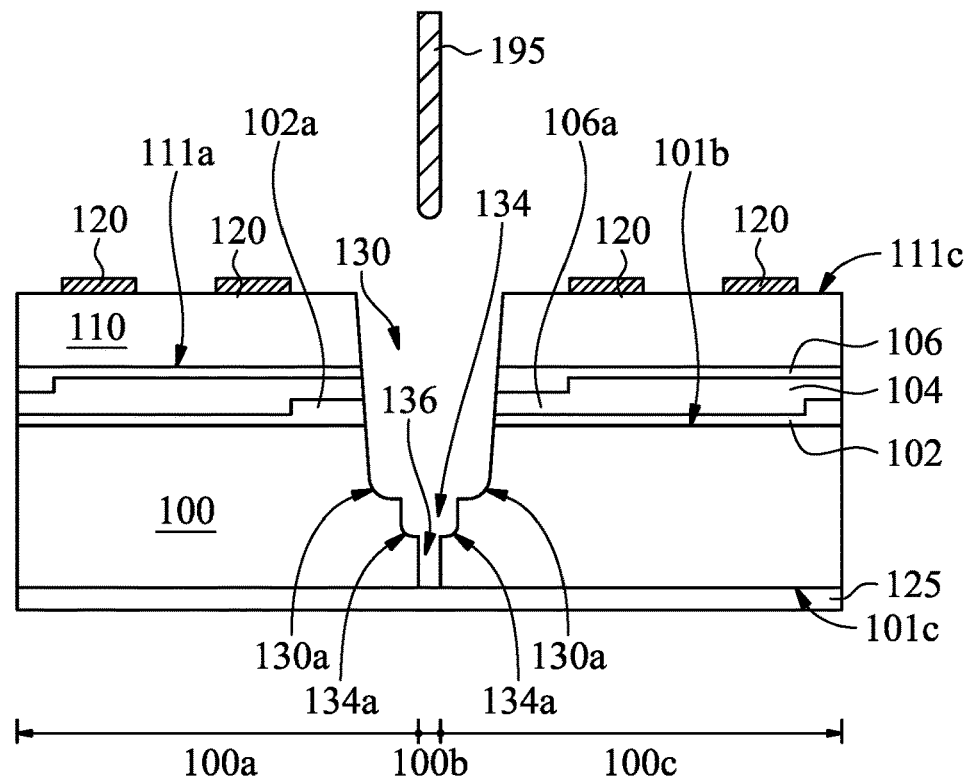

FIGS. 4A to 4B are cross-sectional views of an exemplary embodiment of a method for forming an optical chip package 20 in accordance with some embodiments of the invention. Elements in FIGS. 4A to 4B that are the same as those in FIGS. 2A to 2E are labeled with the same reference numbers as in FIGS. 2A to 2E and are not described again for brevity. Refer to FIG. 4A, the structure shown in FIG. 2D is provided. In such a structure, the opening 130 is formed by a first dicing process using a dicing saw 170 (not shown and as indicated in FIG. 2D).

Afterwards, in some embodiments, an opening 134 is formed below the bottom of the opening 130 by a second dicing process using a dicing saw 190. The opening 134 extends into the first transparent substrate 100 and has rounded corners 134a.

Refer to FIG. 4B, an opening 136 is formed below the bottom of the opening 134 by a third dicing process using a dicing saw 195, to pass through the first transparent substrate 100 and expose the tape layer 125, so that the first transparent substrate 100 has a step-shaped sidewall (e.g., a three-step sidewall). In some embodiments, the opening 130 has a tapered sidewall, and the opening 134 and the opening 136 have a perpendicular sidewall.

In some embodiments, the width of the dicing saw 170 is greater than the widths of the dicing saw 190 and the dicing saw 195, so that the width of the opening 130 is greater than the widths of the opening 134 and the opening 136. In some embodiments, the width of the dicing saw 170 is about 200 µm, the width of the dicing saw 190 is about 150 µm, and the width of the dicing saw 195 is about 120 µm. Moreover, the feed rates of the dicing saw 170 and the dicing saw 195 are less than the feed rate of the dicing saw 190. For example, the feed rate of the dicing saw 170 is about 5 mm/sec, the feed rate of the dicing saw 190 is about 12 mm/sec, and the feed rate of the dicing saw 195 is about 5 mm/sec. The tape layer 125 is removed after performing the three-step dicing process, so as to form an individual optical chip package 20 having the recess structure 140', as shown in FIG. 3.

Similarly, since the fabrication of the optical chip package 20 uses different dicing saws to perform the three-step dicing process, the loading of the dicing saw can be reduced as compared to the use of a single dicing saw to perform the single dicing process, thereby increasing the stability of the dicing process and preventing or mitigating the chipping of the optical chip package 20.

Figure 5:
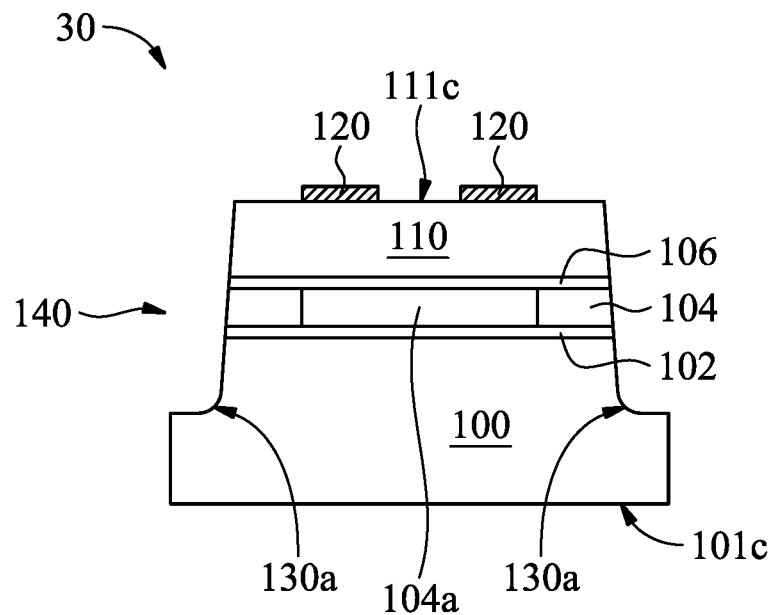
FIG. 5 is a cross-sectional view of an exemplary embodiment of an optical chip package in accordance with some embodiments of the invention.

Refer to FIG. 5, which is a cross-sectional view of an exemplary embodiment of an optical chip package 30 in accordance with some embodiments of the invention. Elements in FIG. 5 that are the same as those in FIG. 1 are labeled with the same reference numbers as in FIG. 1 and are not described again for brevity. The structure of the optical chip package 30 is similar to that of the optical chip package 10 shown in FIG. 1. The difference is the spacer layer 104 of the optical chip package 30 includes an opening 104a to expose the first optical material layer 102 and the second optical material layer 106. In this case, there is a cavity formed by the opening 104a and between the first transparent substrate 100 and the second transparent substrate 110. In some embodiments, the spacer layer 104 is formed of an opaque insulating material, such as a black photoresist or another suitable material.

Figure 6:
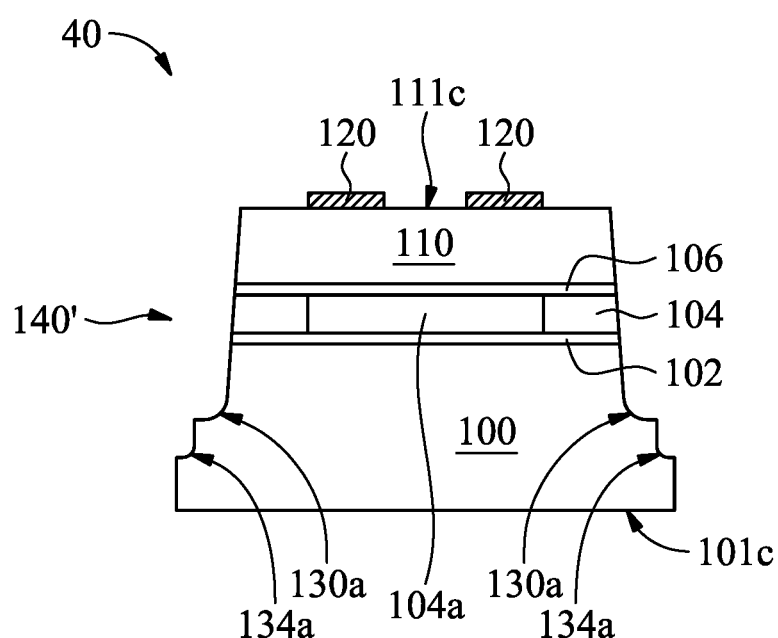
FIG. 6 is a cross-sectional view of an exemplary embodiment of an optical chip package in accordance with some embodiments of the invention.

Refer to FIG. 6, which is a cross-sectional view of an exemplary embodiment of an optical chip package 40 in accordance with some embodiments of the invention. Elements in FIG. 6 that are the same as those in FIG. 3 are labeled with the same reference numbers as in FIG. 3 and are not described again for brevity. The structure of the optical chip package 40 is similar to that of the optical chip package 20 shown in FIG. 3. The difference is the spacer layer 104 of the optical chip package 40 includes an opening 104a to expose the first optical material layer 102 and the second optical material layer 106. In this case, there is a cavity formed by the opening 104a and between the first transparent substrate 100 and the second transparent substrate 110. In some embodiments, the spacer layer 104 is formed of an opaque insulating material, such as a black photoresist or another suitable material.

According to the aforementioned embodiments, since the fabrication of the optical chip package uses different dicing saws to perform the multi-step dicing process, the loading of the dicing saw can be reduced as compared to the use of a single dicing saw to perform the single dicing process, thereby increasing the stability of the dicing process and preventing or mitigating the chipping of the optical chip package. As a result, the optical chip package can be prevented from the cosmetic defect, increase the dicing performance, and have a good package size control, thereby increasing the yield.

Moreover, according to the aforementioned embodiments, the thickness of the first transparent substrate and the second transparent substrate can each be adjusted according to the film stresses of the first optical material layer and the second optical material layer, so that the thickness of the first optical transparent substrate is different than the thickness of the second optical transparent substrate. Therefore, the film stress difference from the first optical material layer and the second optical material layer can be withstood by the thicker transparent substrate, thereby preventing or reducing the warpage of the bonded first and second transparent substrates. As a result, it is not necessary to use an additional carrier substrate to bond the first transparent substrate or the second transparent substrate for the subsequent dicing process. Moreover, the handling ability of the robot end-effector for the bonded first and second transparent substrates can be improved. Accordingly, the manufacturing cost can be reduced and the throughput can be increased.

While the invention has been disclosed in terms of the preferred embodiments, it is not limited. The various embodiments may be modified and combined by those skilled in the art without departing from the concept and scope of the invention.

What is claimed is:

1. An optical chip package, comprising:
   a first transparent substrate having a first surface and a second surface opposite the first surface;
   a second transparent substrate formed over the first transparent substrate and having a first surface and a second surface opposite the first surface; and
   a spacer layer bonded between the second surface of the first transparent substrate and the first surface of the second transparent substrate,
   wherein a recess region extends from the second surface of the second transparent substrate into the first transparent substrate, so that the first transparent substrate has a step-shaped sidewall and the second transparent substrate has a tapered sidewall, and wherein a thickness of the first transparent substrate is different than a thickness of the second transparent substrate.

2. The optical chip package as claimed in claim 1, wherein the recess region surrounds the first transparent substrate, the spacer layer, and the second transparent substrate.

3. The optical chip package as claimed in claim 2, wherein the recess region comprises a first recess that has a bottom below the second surface of the first transparent substrate and has a rounded corner.

4. The optical chip package as claimed in claim 3, wherein the first recess has a tapered sidewall.

5. The optical chip package as claimed in claim 1, wherein the spacer layer is made of a transparent insulating material.

6. The optical chip package as claimed in claim 1, wherein the first transparent substrate and the second transparent substrate are formed of glass or quartz.

7. The optical chip package as claimed in claim 1, further comprising:
   a conductive pattern layer disposed on the first surface of the first transparent substrate or the second surface of the second transparent substrate.

8. An optical chip package as claimed in claim 3, comprising:
   a first transparent substrate having a first surface and a second surface opposite the first surface;
   a second transparent substrate formed over the first transparent substrate and having a first surface and a second surface opposite the first surface; and
   a spacer layer bonded between the second surface of the first transparent substrate and the first surface of the second transparent substrate,
   wherein a recess region surrounds the first transparent substrate, the spacer layer, and the second transparent substrate and extends from the second surface of the second transparent substrate into the first transparent substrate, so that the first transparent substrate has a step-shaped sidewall and the second transparent substrate has a tapered sidewall, and wherein a thickness of the first transparent substrate is different than a thickness of the second transparent substrate,
   wherein the recess region comprises:
      a first recess having a bottom below the second surface of the first transparent substrate and having a rounded corner; and
      a second recess extending from the bottom of the first recess toward the first surface of the first transparent substrate, and having a rounded corner.

9. The optical chip package as claimed in claim 8, wherein the first recess has a tapered sidewall and the second recess has a perpendicular sidewall.

10. An optical chip package, comprising:
    a first transparent substrate having a first surface and a second surface opposite the first surface;
    a second transparent substrate formed over the first transparent substrate and having a first surface and a second surface opposite the first surface;
    a spacer layer bonded between the second surface of the first transparent substrate and the first surface of the second transparent substrate;
    a first optical material layer disposed between the second surface of the first transparent substrate and the spacer layer; and a second optical material layer disposed between the first surface of the second transparent substrate and the spacer layer, wherein a recess region extends from the second surface of the second transparent substrate into the first transparent substrate, so that the first transparent substrate has a step-shaped sidewall, and wherein a thickness of the first transparent substrate is different than a thickness of the second transparent substrate, and wherein a film stress of the first optical material layer is different than a film stress of the second optical material layer.

11. The optical chip package as claimed in claim 10, wherein the film stress of the first optical material layer is less than the film stress of the second optical material layer, and the thickness of the first transparent substrate is greater than the thickness of the second transparent substrate.

12. The optical chip package as claimed in claim 10, wherein the film stress of the first optical material layer is greater than the film stress of the second optical material layer, and the thickness of the first transparent substrate is less than the thickness of the second transparent substrate.

13. The optical chip package as claimed in claim 10, wherein the spacer layer has an opening to expose the first optical material layer and the second optical material layer.

14. The optical chip package as claimed in claim 13, wherein the spacer layer is formed of an opaque insulating material.

15. A method for forming an optical chip package, comprising:

providing a first transparent substrate and a second transparent substrate, wherein the first transparent substrate and the second transparent substrate each has a first surface and a second surface opposite the first surface, and comprises a chip region and a scribe line region surrounding the chip region;

bonding the second surface of the first transparent substrate to the first surface of the second transparent substrate using a spacer layer;

performing a thinning process on the first surface of the first transparent substrate and the second surface of the second transparent substrate, so that the thickness of the first transparent substrate is different than the thickness of the second transparent substrate; and performing a first dicing process through the use of a first dicing saw, to form a first opening in the scribe line region of the first transparent substrate and the scribe line region of the second transparent substrate, wherein the first opening extends from the second surface of the second transparent substrate into the first transparent substrate.

16. The method as claimed in claim 15, further comprising:

performing a second dicing process with a second dicing saw, to form a second opening below a bottom of the first opening and passing through the first transparent substrate, so that the first transparent substrate has a step-shaped sidewall.

17. The method as claimed in claim 16, wherein the bottom of the first opening is located below the second surface of the first transparent substrate and has a rounded corner.

18. The method as claimed in claim 16, wherein the first opening has a tapered sidewall and the second opening has a perpendicular sidewall.

19. The method as claimed in claim 15, further comprising:

performing a second dicing process with a second dicing saw, to form a second opening below the bottom of the first opening, wherein the second opening extends into the first transparent substrate; and using a third dicing saw to perform a third dicing process, to form a second opening below a bottom of the second opening and passing through the first transparent substrate, so that the first transparent substrate has a step-shaped sidewall.

20. The method as claimed in claim 19, wherein the bottom of the first opening and the bottom of the second opening are located below the second surface of the first transparent substrate and each has a rounded corner.

21. The method as claimed in claim 19, wherein the first opening has a tapered sidewall, and the second opening and the third opening have a perpendicular sidewall.

22. The method as claimed in claim 15, further comprising:

forming a first optical material layer on the second surface of the first transparent substrate and forming a second optical material layer on the first surface of the second transparent substrate before bonding the first transparent substrate to the second transparent substrate, so that the spacer layer is formed between the first optical material layer and the second optical material layer, wherein the film stress of the first optical material layer is different than the film stress of the second optical material layer.

23. The method as claimed in claim 22, wherein the film stress of the first optical material layer is less than the film stress of the second optical material layer, and the thickness of the first transparent substrate is greater than the thickness of the second transparent substrate.

24. The method as claimed in claim 22, wherein the film stress of the first optical material layer is greater than the film stress of the second optical material layer, and the thickness of the first transparent substrate is less than the thickness of the second transparent substrate.

25. The method as claimed in claim 22, wherein the spacer layer has an opening to expose the first optical material layer and the second optical material layer.

26. The method as claimed in claim 25, wherein the spacer layer is formed of an opaque insulating material.

27. The method as claimed in claim 15, wherein the spacer layer is made of a transparent insulating material.

28. The method as claimed in claim 15, wherein the first transparent substrate and the second transparent substrate are formed of glass or quartz.

29. The method as claimed in claim 15, further comprising:

forming a conductive pattern layer on the first surface of the transparent substrate or the second surface of the second transparent substrate after the thinning process and before the first dicing process.

* * * * *